(12) United States Patent
Wagner

(10) Patent No.: US 7,345,538 B2
(45) Date of Patent: Mar. 18, 2008

(54) MEASURING CIRCUIT FOR THE OUTPUT OF A POWER AMPLIFIER AND A POWER AMPLIFIER COMPRISING THE MEASURING CIRCUIT

(75) Inventor: Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/534,938

(22) Filed: Sep. 25, 2006

(65) Prior Publication Data

US 2007/0109042 A1 May 17, 2007

Related U.S. Application Data

(63) Continuation of application No. PCT/DE2005/000429, filed on Mar. 10, 2005.

(30) Foreign Application Priority Data

Mar. 25, 2004 (DE) ............... 10 2004 014 731

(51) Int. Cl.
*H03G 3/20* (2006.01)
(52) U.S. Cl. .................................. 330/140; 330/2
(58) Field of Classification Search .............. 330/2, 330/140; 324/616; 455/115.1–115.3, 127.1–127.3
See application file for complete search history.

(56) References Cited

U.S. PATENT DOCUMENTS

| 4,620,114 | A | * | 10/1986 | Moon | ............................. 330/2 |
| 5,287,055 | A | | 2/1994 | Cini et al. | .................... 324/158 |
| 5,546,050 | A | | 8/1996 | Florian et al. | ............... 330/282 |
| 6,424,191 | B1 | | 7/2002 | Nayebi et al. | ............... 327/156 |
| 2002/0118034 | A1 | | 8/2002 | Laureanti | ...................... 324/765 |

FOREIGN PATENT DOCUMENTS

| DE | 69101386 T2 | 10/1994 |
| WO | 9614665 | 5/1996 |
| WO | 2005096005 | 10/2005 |

OTHER PUBLICATIONS

International Search Report with Written Opinion, PCT/DE2005/00429, 7 pages. Mailed on Jul. 26, 2005.

* cited by examiner

*Primary Examiner*—Khanh Van Nguyen
(74) *Attorney, Agent, or Firm*—Dicke, Billig & Czaja, PLLC

(57) ABSTRACT

A measuring circuit for the output of a power amplifier and a power amplifier comprising the measuring circuit comprises a first transistor (4f). The output current (27) of the first transistor (4f) is characteristic of the output current (28) of the amplifier (20), in particular, the above is essentially proportional to the output current (28) of the amplifier (20). The first transistor (4f) is controlled in parallel to at least one second transistor (4a-4e), driving the amplifier output (8).

26 Claims, 1 Drawing Sheet

MEASURING CIRCUIT FOR THE OUTPUT OF A POWER AMPLIFIER AND A POWER AMPLIFIER COMPRISING THE MEASURING CIRCUIT

CROSS-REFERENCE TO RELATED APPLICATION

This application is a continuation of co-pending International Application No. PCT/DE2005/000429 filed Mar. 10, 2005, which designates the United States, and claims priority to German application number DE 10 2004 014 731.0 filed Mar. 25, 2004.

TECHNICAL FIELD

The invention relates to a measuring circuit for an output of an amplifier and to an amplifier comprising the measuring circuit, in particular a radio frequency power amplifier. Furthermore, the invention relates to a regulating circuit comprising the measuring circuit and to a measuring method for an amplifier output.

BACKGROUND

In mobile radio systems, provision is often made for measuring the output power in order to regulate the output power on the basis of the measured output power. Particularly in the case of mobile radio systems which utilize a variable-amplitude transmission method, it is generally necessary to measure and regulate the output power. One typical example of a variable-amplitude transmission method is so-called OFDM (orthogonal frequency division multiplexing), which is used particularly in WLAN radio systems according to the IEEE 802.11a/h Standard (transmission frequency in the region of 5 GHz) or 802.11g Standard (transmission frequency in the region of 2.4 GHz). In this case, the frequency band available for the radio transmission is subdivided into orthogonal partial frequency bands, for example 52 partial frequency bands, between which the data traffic of a radio link is divided. In this case, the output power as a superposition of the power of all the partial frequency bands may fluctuate over a wide dynamic range (approximately 17 dB) on account of the interference of the partial frequency bands. However, even in mobile radio systems according to the EDGE or UMTS Standard, which use a higher-order phase modulation (PSK—phase shift keying), the amplitude of the output signal is variable. Power regulation based on power measurement enables the optimum output power for the respective operating state to be present without the power amplifier that drives the transmission antenna being overdriven.

The output power is generally measured on the basis of the output voltage. This is usually done by measuring the voltage swing at the output of the power amplifier driving the transmission antenna. What is disadvantageous about the measurement on the basis of the output voltage is that the output voltage is dependent on the load of the power amplifier, as a result of which the output power measured on the basis of the output voltage may differ significantly from the power actually present. In particular for the case where the actual load on the power amplifier, that is to say the antenna with an optional matching network, deviates from the typical load for example due to component variation, aging or temperature effects, the actual output power cannot be deduced solely on the basis of the measurement based on the output voltage. A mismatch on the output side is present in this case.

When regulating the output power on the basis of the output voltage, the function of the power amplifier can be considerably impaired. The case where the load impedance of the power amplifier is lower than the typical value is conceivable, by way of example. If, in this case, the output amplifier already supplies the maximum possible swing of the output current, the actual swing of the output voltage is nevertheless lower than the maximum possible swing of the output voltage that should be sought on the part of the power regulation. The power regulation reacts to the measured power information based on the output voltage in such a way that it attempts to increase the swing of the output current. This causes the output stage of the power amplifier to be driven at the limit, so that the output signal is distorted by the nonlinear operation of the output stage. In this case, therefore, the power regulation drives the power amplifier into limiting operation.

Conversely, if the load impedance of the power amplifier is higher than the typical value, the misinterpretation of the power information measured on the basis of the output voltage on the part of the power regulation has the effect that the regulated output power is too low. Thus, the risk for power regulation that is based only on the measurement of the output voltage is that either the regulated output power is too low or the output amplifier is operated at the limit as a result of the regulation.

The problem described above can be avoided by providing an external directional coupler between the power amplifier and the antenna. Such a directional coupler has two measurement outputs, the output voltage of a radio frequency detector at the first measurement output being proportional to the power transmitted to the antenna and the output voltage of a radio frequency detector at the second measurement output being proportional to the power reflected from the antenna. The power radiated on the part of the antenna can be determined from the difference between the two variables. What is disadvantageous about such a solution is that additional components such as an external directional coupler and one or two radio frequency detectors are required. This causes additional costs and enlargement of the transmitter.

SUMMARY

A measuring circuit for an amplifier whose output magnitude can be used for regulating the amplifier, in particular for regulating the output power of the amplifier, may have an optimum operating point of the output stage of the amplifier. A measuring circuit for an output of an amplifier, may comprise a first transistor, the output current of which is characteristic of the output current of the amplifier and which is driven in parallel with at least one second transistor driving the amplifier output, and a means for providing a variable that is characteristic of the output power, the means being designed for determining the variable that is characteristic of the output power by multiplication of the output current of the first transistor or an electrical voltage dependent on said output current and the electrical variable characteristic of the output voltage of the amplifier.

BRIEF DESCRIPTION OF THE DRAWINGS

The invention is explained in more detail below on the basis of a plurality of exemplary embodiments with reference to the drawings, in which.

DETAILED DESCRIPTION

Figure 1:
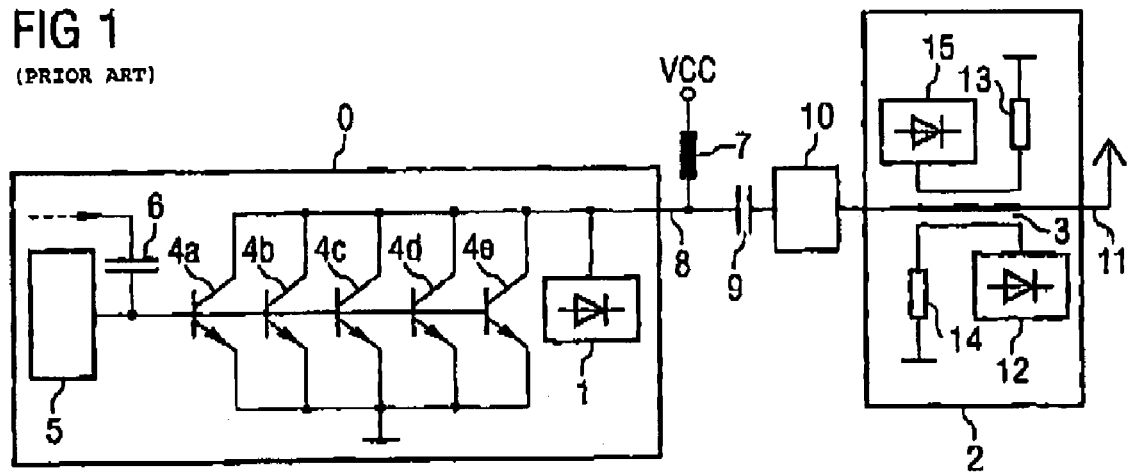
FIG. 1 shows circuitry interconnection of a power amplifier for specifying the output power according to the prior art.

The measuring circuit should be able to be implemented at minimal cost and with minimal outlay. An amplifier, in particular radio frequency power amplifier, may comprise such a measuring circuit.

The measuring circuit according to an embodiment for an output of an amplifier may comprise a first transistor. In this case, the output current of the first transistor can be characteristic of the output current of the amplifier; in particular, said output current is essentially proportional to the output current of the amplifier. The first transistor may be driven in parallel with at least one second transistor driving the amplifier output.

A multiplicity of second transistors connected in parallel may be typically used instead of a single second transistor. With regard to the driving in parallel, it can be indeed advantageous but not absolutely necessary for the driven terminals of the first and of the at least one second transistor to be directly short-circuited. Driving in parallel may also be present in the sense of the application when a network is arranged between the terminals of the first and of the at least one second transistor. By way of example, it would be conceivable for the first transistor and the at least one second transistor to be driven by an emitter follower in each case. Both emitter followers being driven with the same signal.

The current signal of the at least one second transistor, which signal is provided by the measuring circuit according to an embodiment, enables an indirect current measurement of the output current of the amplifier. The current signal provided by the measuring circuit can be used diversely for regulating the amplifier. On the basis of the current signal it is possible to read directly whether the second transistor is operating in the linear range or is already being overdriven. This information can be taken into account in the regulation of the output power. Further, by combining the measured current signal and the additionally measured output voltage, it can be possible to determine one or a plurality of variables dependent thereon for power regulation. In particular, the output power can be determined by multiplication of the output current and the output voltage.

The measuring circuit may require only a low additional outlay on circuitry; in particular, it can be implemented together with the amplifier in a monolithic integrated circuit. Furthermore, the function of the at least one second transistor is not impaired as a result of the use of the measuring circuit; the maximum possible output swing is not reduced as a result of the use of the measuring circuit. By contrast, in the case where the output current is measured—in a manner that is not according to an embodiment—by means of additional resistors connected in series with a terminal carrying the output current, (for example in series with the emitter or collector terminal in a common-emitter circuit) of the at least one second transistor the maximum possible output swing of the at least one second transistor is reduced.

It can be advantageous if the first transistor of the measuring circuit and the at least one second transistor driving the amplifier output are operated in a common-emitter circuit or common-source circuit. In this case, it may be advantageous if the base terminal or the gate terminal and the emitter terminal or source terminal of the first transistor are short-circuited with the respectively corresponding terminal of the at least one second transistor driving the amplifier output.

The parallel circuit described above in each case may make it possible for the base-emitter voltage (implementation using bipolar transistors) or the gate-source voltage (implementation using MOS transistors) of the first transistor and of the at least one second transistor to correspond to one another.

If may be advantageously furthermore required that the first transistor is of the same type as the at least one second transistor driving the amplifier output, the output current of the first transistor is approximately proportional to the output current of the at least one second transistor. In accordance with the functioning of a so-called current mirror, what holds true for this case is that the ratio of the output current of the first transistor to the output current of the at least one second transistor driving the amplifier output may correspond to the area ratio of the two aforementioned transistors. In the case of common monolithic integration of the amplifier and the measuring circuit, component variation, aging or temperature effects affect both transistors to the same extent, so that the proportionality factor between the output current of the first transistor and the output current of the at least one second transistor remains constant. This is also referred to as "transistor matching".

The measuring circuit advantageously may comprise a resistor, which converts the output current of the first transistor into an electrical voltage signal. In this case, it may be advantageous if the value of the resistor is lower, in particular significantly lower, than the output impedance of the first transistor. This affords the advantage that the magnitude of the current flowing through the output impedance of the first transistor is low. In this case, the output current of the first transistor and also the electrical voltage single at the resistor are proportional to the short-circuit current of the at least one second transistor.

It may be advantageous if the measuring circuit comprises a means for providing a variable which is characteristic of the function of the at least one second transistor driving the amplifier output. The means determines the variable in a manner dependent on the output current of the first transistor or a voltage dependent on the output current of the first transistor. The variable that is characteristic of the function relates to the output-side matching of the amplifier and/or the output power of the amplifier. As an alternative or in addition, it may also relate to the modulation of the at least one second transistor driving the amplifier output. Preferably, but not necessarily, the variable that is characteristic of the function may additionally be dependent on the output voltage of the amplifier as well.

In the sense of the application, a variable that is characteristic of the function of the at least one second transistor driving the amplifier output can be a variable that specifies how the at least one second transistor is operated with regard to its function, in particular with regard to the power amplification, in the amplifier circuit. A variable that is characteristic of the function may be for example a variable that is characteristic of the matching or mismatch. If a mismatch is present, this may influence the power amplification of the at least one second transistor. In the case of a mismatch, the output power can be lower than the maximum possible power in the case of power matching. However, a variable that is characteristic of the function may also be a variable that is characteristic of the output power and can be used directly for regulating the output power. A variable that is characteristic of the function may furthermore also reside in a specification for the modulation of the at least one second transistor. If overdriving of the at least one second transistor is present, the output voltage is distorted, so that the function of the at least one second transistor, namely power amplification that is as linear as possible, is no longer provided.

The measuring circuit advantageously may comprise a means, in particular a radio frequency detector, for providing an electrical variable that is characteristic of the output voltage of the amplifier. In the simplest case, said means merely may comprise tapping the output voltage.

Said tapping may be provided with a high impedance by means of an additional resistor, so that the influence of the tapping on the output of the amplifier is negligible. In the case where a radio frequency detector is used, generally an averaged output signal is formed in a manner dependent on the output voltage of the amplifier. However, said signal then no longer may contain any phase information.

According to one embodiment, the measuring circuit may comprise a means for providing a variable that is characteristic of the output power. In this case, the means may determine the variable in a manner dependent on the output current of the first transistor or an electrical voltage dependent on said output current. Furthermore, the electrical variable that is characteristic of the output voltage of the amplifier can be used for determining the variable that is characteristic of the output power. The means preferably carries out a multiplication for determining a variable that is characteristic of the output power. It may be advantageous if the measuring circuit comprises a mixer for this purpose. The output signal of the mixer may have a DC current component and an AC current component at double the frequency of the output voltage. The AC current component can be suppressed by an additional low-pass filter. The DC current component of the output signal of the mixer may be proportional to the output power of the amplifier.

According to an alternative embodiment, the measuring circuit may comprise a means for providing a variable that is characteristic of the impedance at the amplifier output. The means may determine the variable in a manner dependent on the electrical variable characteristic of the output voltage of the amplifier and the output current of the first transistor. Instead of the output current, an electrical voltage dependent on said output current may also be used as input variable for the abovementioned means. The variable that is characteristic of the impedance can be advantageously determined by a division. Depending on the choice of numerator and denominator, an impedance or an admittance may result as the output variable. The output variable can be used to ascertain whether or not a mismatch is present.

According to an alternative embodiment, the measuring circuit may comprise a means for providing a variable that is characteristic of the standing wave ratio or of the reflection factor. In this case, the means may determine the variable in a manner dependent on the output current of the first transistor or an electrical voltage dependent on said output current. Furthermore, the electrical variable that is characteristic of the output voltage of the amplifier can be used for determining the variable that is characteristic of the output power.

According to a further alternative embodiment, the measuring circuit may comprise a means for providing an electrical variable that is characteristic of the phase difference between the output current of the first transistor and the electrical variable that is characteristic of the output voltage of the amplifier. Said means can be preferably a phase comparator. With the aid of the output signal of the phase comparator it may be possible to ascertain whether or not the output of the amplifier is matched at the operating frequency (e.g. 2.4 GHz) of the amplifier. If the output current and the output voltage are not in antiphase, an inductive or capacitive mismatch is present at the frequency considered.

The measuring circuit advantageously may comprise a means which indicates, in a manner dependent on the electrical variable characteristic of the output voltage of the amplifier, whether the at least one second transistor driving the amplifier output is overdriven. This may be done by a comparison of the variable characteristic of the output voltage with the saturation voltage of the second transistor. If the voltage at the output of the amplifier, that is to say at the collector or drain terminal of the at least one second transistor, is lower than the saturation voltage of the at least one second transistor, the at least one second transistor can be overdriven. The amplitude of the driving signal can be reduced in this case.

The amplifier according to an embodiment may comprise such a measuring circuit and also at least one second transistor driving the amplifier output. The amplifier output may be, in particular, an open-collector or open-drain amplifier output. Such an output is characterized in that it has no connection to the supply voltage on-chip. The collector or drain terminal of the at least one second transistor driving the amplifier output may be open-circuited without connection of an amplifier load. However, it is also possible to integrate the matching network into the chip, a connection to the supply voltage then arising. The amplifier can be preferably a radio frequency amplifier, in particular a radio frequency power amplifier.

The regulating circuit according to an embodiment may serve for regulating a variable of such an amplifier determined by such a measuring circuit. In this case, the regulating circuit may comprise such a measuring circuit. The regulating circuit may preferably serve for regulating the output power, a variable that is characteristic of the output power of the amplifier being determined by the measuring circuit and being regulated to its optimum value by the regulating circuit.

In the case of the measuring method according to an embodiment for an output of such an amplifier, the output current of a first transistor can be determined. In this case, the first transistor may be driven in parallel with at least one second transistor driving the amplifier output. The output current can be characteristic of the output current of the amplifier, in particular essentially proportional to the output current of the amplifier.

FIG. 1 illustrates two alternative possibilities for the circuitry interconnection of a monolithic integrated radio frequency power amplifier 0, both of which relate to the measurement of the output power according to the prior art. The first alternative makes use of a radio frequency detector 1, which determines the output power indirectly by means of the output voltage. Alternatively, it is possible to use an off-chip network 2 for specifying the output power, said network comprising a directional coupler 3.

In this case, the radio frequency power amplifier 0 is used in a mobile radio system, for example in a WLAN transmitting device for carrier-frequency-modulated signals in the frequency range of between 2.4 GHz and 2.5 GHz or alternatively for the frequency range of between 5.15 GHz and 5.825 GHz. The output stage of the power amplifier 0 comprises one or more npn-bipolar transistors 4*a*-4*e* which are connected in parallel and drive the output 8 of the power amplifier 0. The output stage of the power amplifier 0 forms a common-emitter circuit. If only a single transistor is used in the output stage, it has a very large active transistor area (emitter area). If, as illustrated here, a plurality of transistors 4a-4e connected in parallel are used, the emitter area of the transistors 4a-4e can be correspondingly reduced. The operating point is set at the base by means of a network 5 that defines the base potential, said network not being illustrated in specific detail. The radio frequency input signal of the output stage is supplied by an amplifier stage (not illustrated) connected upstream of the output stage, the two amplifier stages being coupled for radio-frequency signals via the capacitance 6 (also referred to as so-called AC coupling). The emitter terminals of the transistors 4a-4e are connected to the ground potential.

The amplifier output 8 is an open-collector output, that is to say that an on-chip termination of the output 8 is not provided. The positive operating voltage VCC (e.g. +3.3 V) is fed to the collectors of the transistors 4a-4e via an inductance 7. The DC component of the collector current of the transistors 4a-4e flows via the inductance 7. Like the rest of the passive components on the output side, the inductance 7 may be realized off-chip (as illustrated in FIG. 1) or alternatively on-chip. In this case, off-chip components generally have a higher quality in comparison with on-chip components; with the use of off-chip components the costs increase as a result of more complicated printed circuit board fabrication associated therewith. The amplifier output 8 and the load of the amplifier are AC-coupled with an off-chip capacitance 9, that is to say that the capacitance 9 forms a radio frequency short circuit. A matching network 10 is connected between the actual load of the power amplifier, namely the antenna 11, and the capacitance 9. Said network carries out a transformation of the impedance of the antenna 11. In this case, the matching network is chosen such that power matching is present at the output 8, that is to say that the source impedance corresponds to the complex conjugate load impedance at the output 8. A line (not illustrated) is generally situated between the antenna 11 and the matching network 10 in which case for the purpose of matching, the line impedance corresponds to the impedance of the antenna 11.

In accordance with the first alternative for determining the output power as known from the prior art, the output power at the amplifier output 8 is measured by a radio frequency detector 1. The radio frequency detector 1 comprises a diode and generates a DC voltage or a DC current by diode rectification, the DC voltage or the DC current being proportional to the amplitude of the output voltage. In this case, the square of the amplitude of the output voltage is proportional to the radio frequency output power. What is disadvantageous about this form of power measurement is that the actual output power cannot be deduced from the output variable of the detector 1 if the actual load deviates from the typical load of the power amplifier 0.

It is furthermore known from the prior art, as an alternative to power measurement, as illustrated in FIG. 1, to connect an off-chip network 2 upstream of the antenna 11, said network comprising a directional coupler 3. The directional coupler 3 is interconnected with radio frequency detectors 15 and 12 and also terminating resistors 13 and 14. The radio frequency detector 15 supplies an output magnitude which is proportional to the square root of the power transmitted to the antenna 11 and the radio frequency detector 12 supplies an output magnitude which is proportional to the square root of the power reflected on the part of the antenna 11. The power that is actually emitted can be determined from these two variables. What is disadvantageous about such a solution is that additional external components are required.

Figure 2:
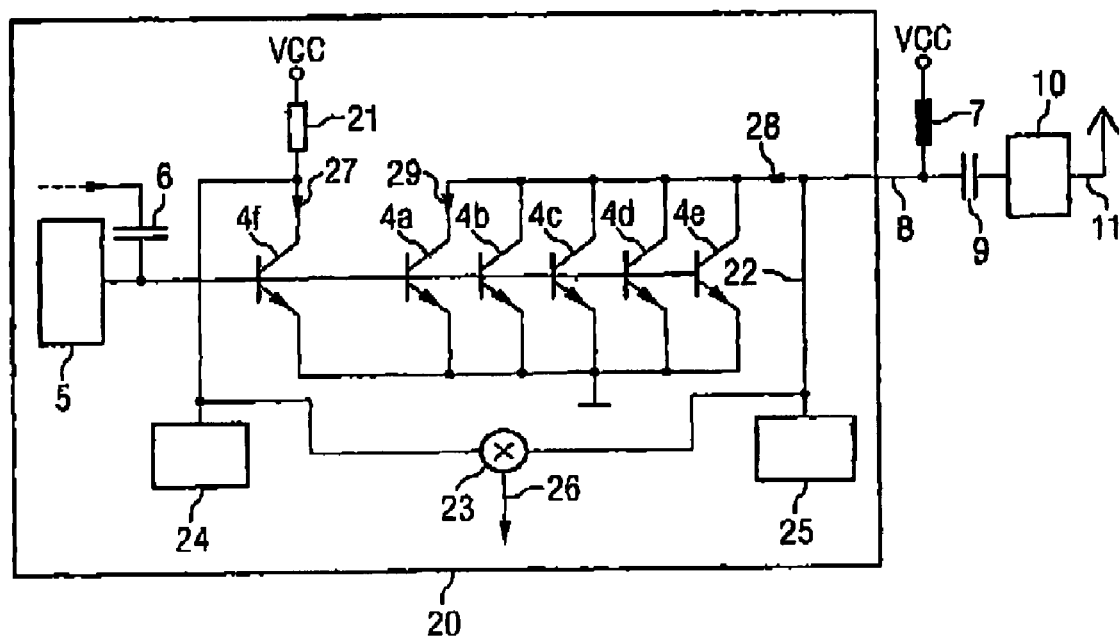
FIG. 2 shows a circuitry interconnection according to an embodiment of a power amplifier according to an embodiment for determining the output current and the output power.

FIG. 2 illustrates the circuitry interconnection according to an embodiment of a monolithic integrated radio frequency power amplifier 20. Illustrated component parts from FIG. 1 and FIG. 2 that are provided with the same reference symbols correspond to one another. In contrast to FIG. 1, a further transistor 4f is connected in parallel with the transistors 4a-4e on the base and emitter sides. In this case the transistor type of the transistor 4f corresponds to that of the transistors 4a-4e. In the present case, the transistor 4f is of the same size as one of the transistors 4a-4e. In this case, the collector of the transistor 4f is not connected to the output 8 of the power amplifier, but rather to a resistor 21. The second terminal of the resistor 21 is connected to the operating voltage VCC, so that the resistor 21 forms the load resistor of the transistor 4f operated in a common-emitter circuit. Provision is furthermore made for making the voltage at the output of the amplifier available via a tap 22. The output voltage provided via the tap 22 and also the voltage dropped across the resistor 21 are fed to a mixer. Radio frequency signal components in the output signal 26 of the mixer can be suppressed by an additional low-pass filter (not illustrated) connected downstream of the mixer. Furthermore, additional circuit blocks 24 and 25 may optionally be provided, the circuit block 24 evaluating the voltage signal dropped across the resistor 21 and the circuit block 25 evaluating the voltage signal occurring at the output 8.

Since the driving of the transistor 4f—as in the case of a current mirror—corresponds to that of the transistors 4a-4e, it is approximately true that the current 27 is proportional to the output current 28 of the transistors 4a-4e. It is true in particular that the output current 27 of the transistor 4f approximately corresponds to the output current 29 of one of the transistors 4a-4e if both are of the same type. The voltage across the resistor 21 is thus approximately proportional to the output current 28 of the power amplifier 20. If the DC current components of the voltage signals at the output 8 and at the resistor 21 are not taken into account (for example by means of an AC coupling not illustrated upstream of the mixer input), the product of these voltage signals is approximately proportional to the active volt-amperes consumed in the load of the power amplifier, that is to say approximately proportional to the power radiated by the antenna 11. If the AC component of the voltage signal at the output 8 is described by $$u1 = a(\cos((t + \ ))\tag{1}$$

and the AC component of the voltage signal at the resistor 21 is described by $$u2 = b(\cos((t + \ ))\tag{2}$$

the output signal of the mixer 23 in the linear modulating range of the mixer is proportional to $$u1(u2 = [a(\cos((t+(\ )][(b(\cos((t+(\ )] = a(b(\cos((-(\ )+a(b(\cos(2(t+(+(\ )\tag{3}$$

In accordance with equation 3, the output signal 26 of the mixer has a DC current component and an AC current component at double the frequency of the output voltage. The AC current component can be suppressed by an additional low-pass filter. The DC current component of the output signal 26 of the mixer is then proportional to that power which is consumed in the load of the amplifier 20. It is evident in this case that the measured value determined for the power is dependent both on the amplitudes a, b of the voltage signals u1, u2 and on the phase difference (−( of the voltage signals u1, u2. It holds true in this case that the phase difference is zero when the output of the power amplifier has been matched. If a capacitive or inductive mismatch is present, the phase difference is different from zero. In this case, a portion of the power transmitted to the antenna 11 is reflected and not absorbed in the antenna 11. Since the output signal is dependent on the phase difference, the mixer simultaneously also operates as a phase comparator.

The active volt-ampere consumed in the antenna represents the maximum possible active voltage-amperes when the voltage signals u1, u2 are in phase, (or the current of the transistor 4f and the voltage at the output 8 are in antiphase) and the voltage swing at the output 8 of the power amplifier 20 has the maximum permissible value and the current through the transistors is maximal. If the maximum permissible value of the voltage swing at the output 8 of the power amplifier 20 is exceeded, the output stage of the power amplifier 20 operates in greatly nonlinear fashion. The output signal is virtually as it were "clipped" on account of the limitation to the operating voltage (maximal) and the saturation voltage (minimal). If the voltage swing at the output of the power amplifier is lower than the maximum permissible voltage swing the maximum possible power is not absorbed in the antenna 11. This is the case when the impedance at the output 8 of the amplifier 20 is too low. If, by contrast, the maximum permissible voltage swing at the output 8 of the amplifier 20 is exceeded, the impedance at the output 8 of the amplifier 20 is too high. If the voltage signals u1, u2 are not in phase by contrast, a capacitive or inductive mismatch is present.

In order to maximize the power absorbed in the antenna 11 without overdriving the output stage of the power amplifier 20, therefore, a plurality of variables should be monitored in the regulating circuit for power regulation: firstly the phase difference or the absorbed power resulting from the output signal of the mixer, and secondly the voltage swing at the output 8 of the amplifier 20. In order to monitor the voltage swing at the output 8, the circuit block 25 may be embodied as a radio frequency detector. The circuit block 25 may alternatively be configured in such a way that it compares the voltage at the output 8 of the amplifier 20 with the saturation voltage (typically in the range of 100 mV to 400 mV depending on transistor type and temperature) between collector and emitter of the transistors 4a-4e. If the lowest voltage occurring at the output 8 is exactly equal to or less than the saturation voltage, the output stage of the power amplifier 20 is overdriven. The amplitude of the voltage at the output 8 must be reduced in this case.

The circuit illustrated in FIG. 2 can also be modified in accordance with an embodiment to the effect that other variables that are characteristic of the function of the transistors 4a-4e are determined. In particular, a circuit block which measures the impedance at the output of the amplifier 20 being provided instead of the mixer 23. If, in a circuit block of this type, the phasors of the AC component of the voltage at the output 8 and of the voltage across the resistor 21 are divided, the result is a variable that is proportional to the impedance at the output 8 of the amplifier.

Further variables such as the standing wave ratio or the reflection factor at the output of the amplifier can be determined in a similar manner by evaluating the AC components of the voltage signals at the output of the resistor 21 and at the output 8 in a manner corresponding to the calculation specification of said variables. The standing wave ratio results in the ratio of the impedance effective at the output 8 to the impendence of the output line (e.g. 50 ohms) or to the transformed impendence of the output line when a matching network 10 is used. In this respect, the standing wave ratio can easily be determined given knowledge of the impedance of the output 8 (as already described above).

With regard to the above statements it should be noted that instead of the voltage across the resistor 21 it is also possible for the current signal 27 to be used directly in an analogous manner.

What is claimed is:

1. A measuring circuit for an output of an amplifier comprising:
    a first transistor, an output current of which is characteristic of an output current of the amplifier and which is driven in parallel with at least one second transistor driving the amplifier output, and
    means for providing a variable that is characteristic of an output power of the amplifier,
    the means being designed for determining the variable that is characteristic of the output power of the amplifier by multiplication of the output current of the first transistor or an electrical voltage dependent on said output current and an electrical variable characteristic of an output voltage of the amplifier.

2. The measuring circuit according to claim 1, wherein the output current of the first transistor is essentially proportional to the output current of the amplifier.

3. The measuring circuit according to claim 1, wherein the first transistor of the measuring circuit and the at least one second transistor driving the amplifier output are operated in a common-emitter connection or common-source connection.

4. The measuring circuit according to claim 3, wherein the base terminal or the gate terminal of the first transistor and an emitter terminal or source terminal of the first transistor are short-circuited with a respectively corresponding terminal of the at least one second transistor driving the amplifier output.

5. The measuring circuit according to claim 1, wherein the first transistor is of the same type as the at least one second transistor driving the amplifier output.

6. The measuring circuit according to claim 1, wherein the measuring circuit comprises a resistor which converts the output current of the first transistor into an electrical voltage signal.

7. The measuring circuit according to claim 6, wherein a value of the resistor being lower than an output impedance of the first transistor.

8. The measuring circuit according to claim 1, wherein the measuring circuit comprises means for providing an electrical variable that is characteristic of the output voltage of the amplifier.

9. The measuring circuit according to claim 8, wherein the means for providing an electrical variable is a radio frequency detector.

10. The measuring circuit according to claim 1, wherein the means is a mixer.

11. The measuring circuit according to claim 1, wherein the measuring circuit comprises means for providing a variable that is characteristic of the impedance at the amplifier output, wherein the means for providing determines the variable in a manner dependent on
    the electrical variable characteristic of the output voltage of the amplifier, and
    the output current of the first transistor or an electrical voltage dependent on said output current.

12. The measuring circuit according to claim 11, wherein the means for providing the variable determines the variable by division of the electrical variable and the output current or the electrical voltage.

13. The measuring circuit according to claim 1, wherein the measuring circuit comprises means for providing a variable that is characteristic
of a standing wave ratio or
of a reflection factor, wherein
the means for providing the variable determines the variable in a manner dependent on
the output current of the first transistors or an electrical voltage dependent on said output current, and
the electrical variable characteristic of the output voltage of the amplifier.

14. The measuring circuit according to claim 1, wherein the measuring circuit comprises means for providing an electrical variable that is characteristic of a phase difference between
the output current of the first transistor and
the electrical variable characteristic of the output voltage of the amplifier.

15. The measuring circuit according to claim 14, wherein the means for providing an electrical variable is a phase comparator.

16. The measuring circuit according to claim 1, wherein the measuring circuit comprises means for indicating, in a manner dependent on the electrical variable characteristic of the output voltage of the amplifier, whether the at least one second transistor driving the amplifier output is overdriven.

17. The measuring circuit according to claim 16, wherein the indication is obtained by comparison of the electrical variable with a saturation voltage of the at least one second transistor.

18. The measuring circuit according to claim 7, wherein the measuring circuit comprises means for indicating, in a manner dependent on the electrical variable characteristic of the output current of the amplifier whether the at least one second transistor driving the amplifier output is overdriven.

19. The measuring circuit according to claim 18, wherein the indication is obtained by comparison of the electrical variable with a maximum value of the at least one second transistor.

20. An amplifier, comprising:
an amplifier output;
a measuring circuit comprising:
a first transistor, an output current of which is characteristic of an output current of the amplifier; and
means for providing a variable that is characteristic of an output power of the amplifier, the means being designed for determining the variable that is characteristic of the output power of the amplifier by multiplication of the output current of the first transistor or an electrical voltage dependent on said output current and an electrical variable characteristic of an output voltage of the amplifier; and
at least one second transistor driving the amplifier output, wherein the first transistor is driven in parallel with the at least one second transistor driving the amplifier output.

21. The amplifier according to claim 20, wherein the amplifier output is an open-collector or open-drain amplifier output.

22. The amplifier according to claim 20, wherein the amplifier is a radio frequency amplifier or a radio frequency power amplifier.

23. A regulating circuit for regulating a variable of an amplifier as claimed in claim 20.

24. The regulating circuit according to claim 23, wherein the circuit regulates the output power.

25. A measuring method for an output of an amplifier, the method comprising:
determining an output current of a first transistor, the output current being characteristic of an output current of the amplifier, and the first transistor being driven in parallel with at least one second transistor driving the amplifier output, and
determining a variable that is characteristic of an output power by multiplication of the output current of the first transistor or an electrical voltage dependent on said output current and an electrical variable characteristic of an output voltage of the amplifier.

26. The measuring method according to claim 25, wherein the output current of the first transistor is essentially proportional to the output current of the amplifier.

* * * * *

UNITED STATES PATENT AND TRADEMARK OFFICE
CERTIFICATE OF CORRECTION

PATENT NO. : 7,345,538 B2
APPLICATION NO. : 11/534938
DATED : March 18, 2008
INVENTOR(S) : Wagner It is certified that error appears in the above-identified patent and that said Letters Patent is hereby corrected as shown below:

Column 4, line 10, delete "If" and insert in place thereof --It--.

Column 4, line 35, delete "single" and insert in place thereof --signal--.

Column 5, line 45, delete "abovementioned" and insert in place thereof --above mentioned--.

Column 7, line 16, delete "+3.3 V" and insert in place thereof --+ 3.3 V--.

Column 8, line 49, delete "u1=a (cos( (t+()" and insert in place thereof --$u_1 = a \cdot \cos(\omega t + \alpha)$--.

Column 8, line 53, delete "u2=b(cos( (t+()" and insert in place thereof --$u_2 = b \cdot \cos(\omega t + \beta)$--.

Column 8, line 57-58, delete

"u1 (u2= [a (cos ( (t+ () ] ( [b (cos ( (t+ () ]=a (b (cos ( (-()+a(b) (cos (2 (t+(+()"

and insert in place thereof

--$u_1 \cdot u_2 = [a \cdot \cos(\omega t + \alpha)] \cdot [b \cdot \cos(\omega t + \beta)] + a \cdot b \cdot \cos(2\omega t + \alpha + \beta)$--.

Column 9, line 2, delete "(-(" and insert in place thereof --$\alpha + \beta$--.

Column 9, lines 2, 3, 13 and 31, delete "u1, u2" and insert in place thereof --$u_1, u_2$--.

Column 10, lines 1 and 2, delete "impendence" and insert in place thereof --impedance--.

Signed and Sealed this

Fifth Day of January, 2010

David J. Kappos
*Director of the United States Patent and Trademark Office*